United States Patent [19]

Piccirillo

[11] 4,141,614
[45] Feb. 27, 1979

[54] ELECTRICAL CONNECTING MEANS

[75] Inventor: David P. Piccirillo, Carroll, Ohio

[73] Assignee: Diamond Power Specialty Corporation, Lancaster, Ohio

[21] Appl. No.: 696,030

[22] Filed: Jun. 14, 1976

[51] Int. Cl.² ............................................. H05K 1/04
[52] U.S. Cl. .................................. 339/17 F; 174/68.5; 339/176 MF
[58] Field of Search ...................... 174/68.5; 339/17 F, 339/176 MF; 317/101 F

[56] References Cited

U.S. PATENT DOCUMENTS

| | | | |
|---|---|---|---|
| 3,633,189 | 1/1972 | Billawala | 339/17 F |
| 3,819,989 | 6/1974 | Braune | 339/17 F |

FOREIGN PATENT DOCUMENTS 925520  5/1963  United Kingdom ..................... 174/68.5

OTHER PUBLICATIONS

Sanders, 2-5 Cable with Feeder Arms, Saunder Associates, Inc., 1958.

*Primary Examiner*—Roy Lake
*Assistant Examiner*—E. F. Desmond
*Attorney, Agent, or Firm*—Harness, Dickey & Pierce

[57] ABSTRACT

A flexible supporting sheet formed of insulating material has "printed circuit"-type adherent conductors thereon which are flexible with the sheet and which are so disposed that contact parts which are also carried by the sheet, and which are arranged to be connectable to the individual components of a row of circuit components, are located at the ends of relatively long, straight, parallel hinging portions of the conductors, all of which hinging portions are arranged on the same side of the respective components to which they are to be connected. The sheet can be cut on three sides of each component, and its connected hinging portions of the conductors, to enable bending back an overlying tongue-like section of the sheet for access to the component without severing any of the conductors.

3 Claims, 2 Drawing Figures

ELECTRICAL CONNECTING MEANS

BACKGROUND OF THE INVENTION

So-called printed circuit boards comprised of an insulating sheet or panel having thin conductive leads, connector portions and the like deposited thereon are used to provide electrical connections for many types of components in the electrical and electronic fields. In some instances thin bendable sheets are used having printed circuit conductor and contact components thereon enabling the sheet to be bent so that connections can be made to parts which are not located on a common plane. One problem which has existed as the result of the use of such flexible circuit sheet-type connectors has been that after its installation, the entire sheet overlies the connected components, so that if a component requires servicing or replacement it is frequently impossible to do this without severing and destroying some of the conductors, thereby rendering it necessary to rewire the parts with conventional wiring. Such rewiring in itself can be of great difficulty and may create problems due to the tendency of the heat of the soldering implement to damage delicate parts. It is an object of the present invention to provide an improved flexible printed circuit-type connecting sheet structure which is capable of providing connections to a large number of components even though they lie in different planes, but the conducting elements of which are so arranged that each individual component is readily accessible for servicing or replacement without destroying any part of the sheet or the conductors thereon. The above indicates the overall objective of the present invention. Further objects and advantages will become apparent upon consideration of the present disclosure in its entirety.

BRIEF DESCRIPTION OF THE FIGURES OF DRAWING

DETAILED DESCRIPTION OF THE PREFERRED FORM OF THE INVENTION

Figure 1:
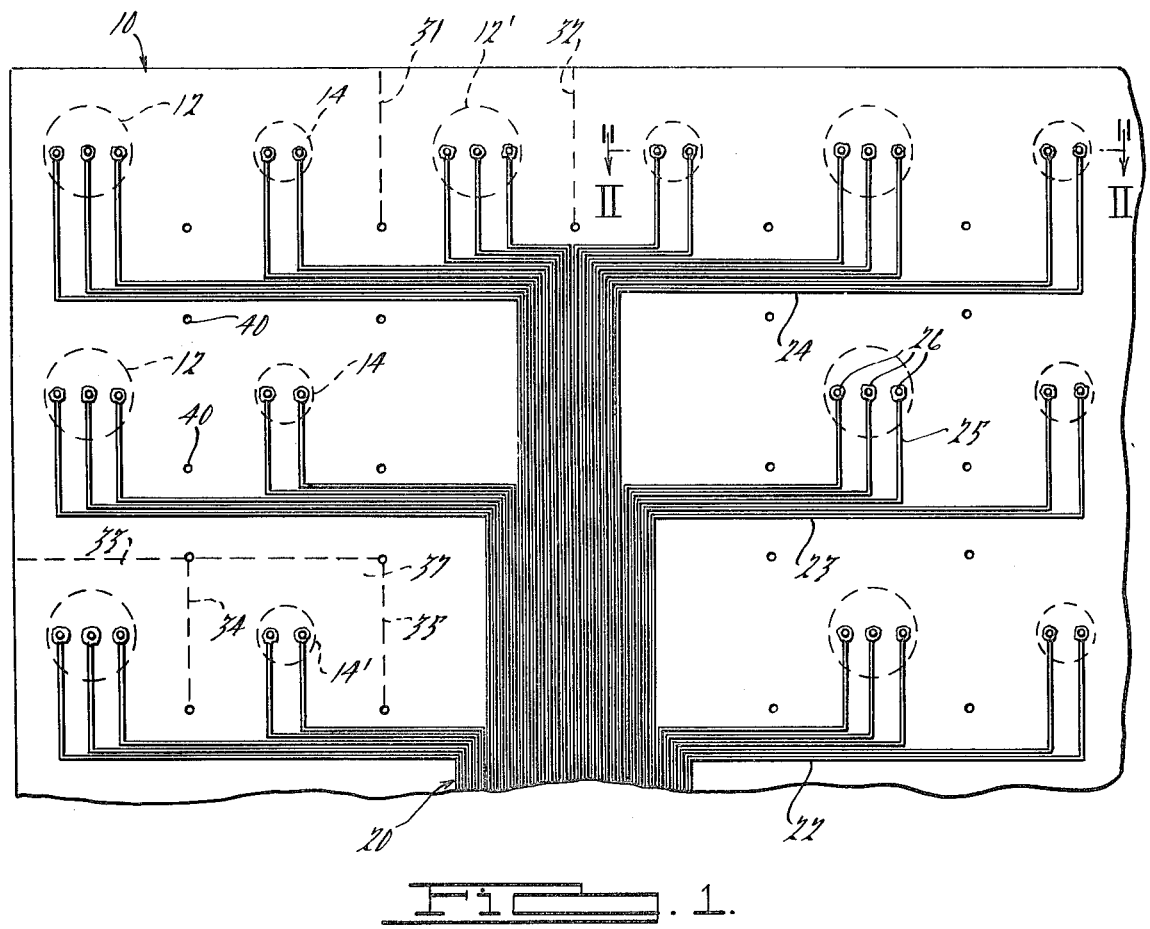
FIG. 1 is a diagrammatic rear elevational view of a portion of a control panel having components connected by means of a flexible connector sheet constructed in accordance with the present invention.

Referring now to the drawing, reference character 10 designates generally a sheet of flexible plastic material which is formed of a composition which is easily manually bendable and which has high electrical insulating value. A polyester plastic such as "Mylar," sold by E. I. du Pont de Nemours & Co. constitutes a suitable material. The sheet 10 is of sufficient thickness to be effectively self-supporting, although no substantial physical strength is normally required, and a thickness of the order of 0.005 to 0.010 inch is adequate for use in installations of sizes normally encountered.

Figure 2:
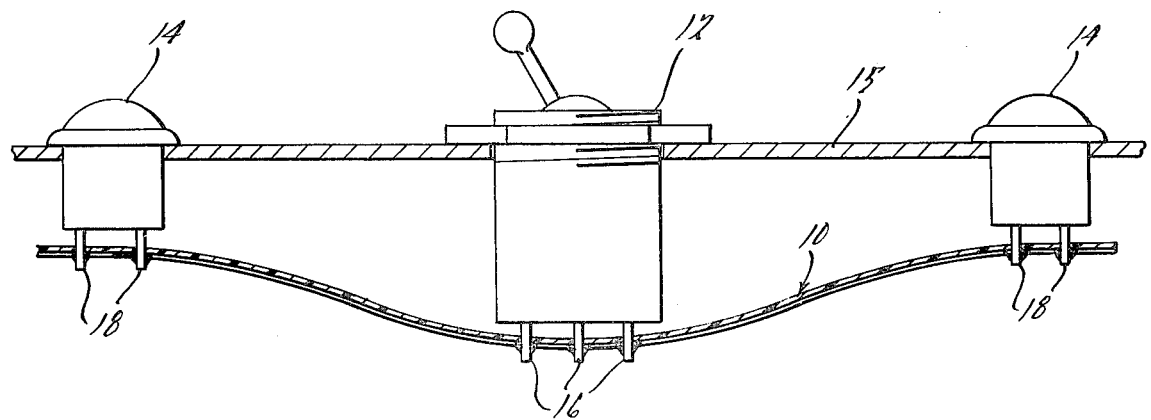
FIG. 2 is a cross-sectional view on a larger scale taken substantially on the line II—II of FIG. 1 and looking in the direction of the arrows.

For the sake of illustration it is presumed that it is desired to provide electrical connections to a plurality of switches 12 and indicator lights 14 which are supported on a stiff supporting panel 15 in the conventional or any suitable manner. Such components are frequently required on control panels for controlling the operation of a plurality of devices, but are merely shown to typify any components to which electrical connections might be required. The switches and indicator lights, as is typical, are provided with terminals 16, 18 which project from the rear behind the supporting panel 15. As brought out in FIG. 2 the flexible conductor supporting sheet 10 is bent during installation to engage the terminals 16, 18, which do not lie in a common plane.

All of the conductive leads for all of the components on the panel are so arranged as to extend in closely adjacent parallel relation from one edge of the sheet 10, shown at the bottom in FIG. 1, perpendicularly upwardly at a position which enables them to extend between the laterally spaced individual components of the horizontal rows of switches and indicator lights. The vertical lead portions just referred to and which are designated 20 are shown as occupying a greater width on the sheet than is actually necessary in practice, due to the limitations of line width imposed in making a drawing for patent illustration purposes. It will be understood by those skilled in the art that they may actually be deposited very close together, while still spaced and insulated sufficiently and without occupying as great a proportion of the width of the sheet as is shown in FIG. 1 so that, for example, the middle and lower horizontal rows, although shown as containing only four components, might still have adequate room for six apiece.

Beneath and spaced from each horizontal row of components the leads extend laterally from the vertical section 20 in horizontal branching continuation portions as 22, 23, 24. In each case the horizontal branching lead portions are spaced substantially below the components to which they are to be connected, and all of the leads for the components in each row are on the same side, shown as the lower side in the illustrated arrangement depicted. In vertical alignment with each component, the leads for such component are turned to the vertical position and extend to the respective terminals of the component, where each is provided with a suitable integral solderable connector lug portion 26. The connector lug portions are positioned to be overfitted on and soldered to the terminals 16, 18. The vertical portions of the leads which connect the horizontal portions 23 to the component are generally designated 25. Such vertical portions are long enough so that they constitute hinging sections which are readily bendable with the circuit sheet about a relatively short radius, without injury. The conductive deposited material is a ductile material such as silver, which is deposited in a flat shape.

By virtue of the fact that the connection portions 25 of the conductors are all located on the same side of the components to which they are connected, and are parallel to one another, it is possible to gain access to each individual component by means of cuts from an edge of the sheet. By means of such cuts, severed edges may be formed at any desired time by service personnel, in such manner as to extend around three sides of any component to which access is required. The cuts also extend beside the connecting hingable conductor portions 25. Access is attained by cutting the sheet along lines extending from the edge in the manner illustrated by way of example by the dotted lines 31 and 32, which extend downwardly from the top of the sheet on both sides of switch element 12', and as also shown in connection with the indicator light component 14' in the bottom row, where a horizontal cut might be made, for example, along the dotted line 33 and connecting vertical cuts 34, 35 will then provide means whereby a tongue section 37 is formed, separated on the top and vertical sides but remaining attached at the bottom. It will be appreciated that the connector lugs can then be released, the tongue 37 bent back, and access had to the underlying component.

I preferably provide circular perforations as 40 located in alignment with the rows both vertically and horizontally, and positioned so as to define the corners of the tongues formed by the cuts made for access in the manner described, and so that by terminating the cuts at such perforations, the danger of stress concentrations and unwanted further tearing and failure which might damage the conductor portions is prevented.

This Detailed Description of Preferred Form of the Invention, and the accompanying drawings, have been furnished in compliance with the statutory requirement to set forth the best mode contemplated by the inventor of carrying out the invention. The prior portions consisting of the "Abstract of the Disclosure" and the "Background of the Invention" are furnished without prejudice to comply with administrative requirements of the Patent and Trademark Office.

What is claimed is:

1. As a new article of manufacture, means for providing electrical connections to a plurality of components which are supported in a plurality of rows in fixed positions relative to each other and which have electrical terminals which do not lie in a common flat plane, comprising a thin, flexible sheet formed of a material having high electrical resistance and which is readily manually bendable and of a size to overlie all of said terminals, contact portions on said sheet so positioned therein as to align with the terminals when the sheet is bent to a contour to bring the contact portions thereon into engagement with the terminals, a plurality of electrically conductive lead elements extending over the sheet in adherent relation thereto in closely adjacent but spaced parallel paths between and parallel to the rows and having branching continuation portions extending perpendicularly from said paths along the sheet for a substantial distance to connection with said contact portions, all of the lead elements for the terminals of each row being grouped in a path lying on the same side of the row, said lead elements being formed of a relatively ductile and readily bendable metal, the sheet being formed of a material which is adapted to be cut without fracturing, whereby the sheet may be cut along lines extending from an edge of the sheet to define severed edges extending around three sides of each component without severing any of the lead elements, and whereby such severed edges define hingeable sections bendable away from the component lying within the area bounded by such severed edges to permit removal and replacement of such component.

2. Means as defined in claim 1 wherein the lead elements extend from an entrance position and on and along the sheet in paths perpendicular to said rows in closely grouped relation and in laterally spaced relation to all of said components before reaching said paths parallel to the rows, and straight cuttable lines may be drawn on said sheet from an edge of the sheet to at least two sides of each component without crossing any lead elements.

3. Means as defined in claim 2 wherein the entrance position is at an intermediate area of one edge of the sheet and the lead elements extend from the entrance position perpendicularly to the rows and between the components before reaching said paths parallel to the rows.

* * * * *